United States Patent

Sun

(10) Patent No.: US 9,488,682 B2
(45) Date of Patent: Nov. 8, 2016

(54) METHOD FOR DETERMINING POWER CONSUMPTION OF LOADS IN UNGROUNDED POWER DISTRIBUTION SYSTEMS

(71) Applicant: Mitsubishi Electric Research Laboratories, Inc., Cambridge, MA (US)

(72) Inventor: Hongbo Sun, Plymouth, MN (US)

(73) Assignee: MITSUBISHI ELECTRIC RESEARCH LABORATORIES, INC., Cambridge, MA (US)

( * ) Notice: Subject to any disclaimer, the term of this patent is extended or adjusted under 35 U.S.C. 154(b) by 803 days.

(21) Appl. No.: 13/771,635

(22) Filed: Feb. 20, 2013

(65) Prior Publication Data

US 2014/0236507 A1    Aug. 21, 2014

(51) Int. Cl.
*G01R 21/06*     (2006.01)
*G06Q 50/06*     (2012.01)
*H02J 3/06*      (2006.01)
(Continued)

(52) U.S. Cl.
CPC .............. *G01R 21/06* (2013.01); *G06F 15/00* (2013.01); *G06Q 50/06* (2013.01); *H02J 3/06* (2013.01); *H02J 3/14* (2013.01); *H02J 2003/001* (2013.01); *H02J 2003/003* (2013.01);
(Continued)

(58) Field of Classification Search
CPC ....... G01R 21/06; G01R 31/88; G06F 15/00; G06Q 50/06; H02J 3/06
USPC ............................ 702/58, 59, 60, 61; 703/18
See application file for complete search history.

(56) References Cited

U.S. PATENT DOCUMENTS

2004/0243377 A1\* 12/2004 Roytelman ............... H02J 3/06
                                                      703/18
2006/0229828 A1\* 10/2006 Hathaway ........... G06F 17/5036
                                                       702/57
(Continued)

FOREIGN PATENT DOCUMENTS

EP        1478074 A2    11/2004
WO    2004057347 A2     7/2004

OTHER PUBLICATIONS

R. Gajbhiye, "Aalysis of Faulted Power Systems in Three Phase Coordinates—A Generic Approach", Power Engineering Conference, 2005. IPEC 2005. The 7th International, (2005).\*
(Continued)

*Primary Examiner* — Mohamed Charioui
*Assistant Examiner* — Catherine Rastovski
(74) *Attorney, Agent, or Firm* — Gene Vinokur; James McAleenan; Hironori Tsukamoto

(57) ABSTRACT

A method determines power consumption of a load in a feeder section of an ungrounded power distribution system. Borders of the feeder section are defined by an importing device connecting the feeder section to an upstream feeder section, and by at least one exporting device connecting the feeder section with a downstream feeder section. A power consumption of each load is represented as a product of a scaling factor and a base power defined by a load profile of the load. A power flow of the feeder section is solved using the power consumptions of the loads to produce an active power for each phase of the importing device. A target active power for each phase of the importing device is determined using measurements at the importing device, and the scaling factors are updated based on a difference between the active power and the target active power.

19 Claims, 8 Drawing Sheets

(51) Int. Cl.
*G06F 15/00* (2006.01)
*H02J 3/14* (2006.01)
*H02J 3/00* (2006.01)

(52) U.S. Cl.
CPC ......... *H02J 2003/007* (2013.01); *Y02E 60/76* (2013.01); *Y04S 10/54* (2013.01); *Y04S 40/22* (2013.01)

(56) References Cited

U.S. PATENT DOCUMENTS

| | | | |
|---|---|---|---|
| 2007/0085549 A1* | 4/2007 | Fischer | G01R 29/16 324/521 |
| 2007/0185665 A1* | 8/2007 | Roytelman | H02J 3/00 702/60 |
| 2010/0094573 A1 | 4/2010 | Yang et al. | |
| 2012/0022713 A1* | 1/2012 | Deaver, Sr. | G05B 17/02 700/298 |
| 2012/0221158 A1 | 8/2012 | Krok et al. | |
| 2012/0283967 A1* | 11/2012 | Duan | H02J 13/0006 702/60 |
| 2013/0346011 A1* | 12/2013 | Ou | H02J 3/06 702/123 |

OTHER PUBLICATIONS

Fink and Beaty, Standard Handbook for Electrical Engineers, 14th Ed., (2000), pp. 2-16 to 2-22.*

Taleski et al. "Energy Summation Method for Energy Loss Computation in Radial Distribution Networks," IEEE Transactions on Power Systems, IEEE Service Center. Piscataway NJ, vol. 11, No. 2, p. 01104-1111, May 1, 1996.

Chun-Lien, Stochastic Evaluation of Voltages in Distribution Networks with Distributed Generation using Detailed Distribution Operation Models, IEEE Transactions on Power Systems, vol. 25, No. 2, pp. 786-795, May 1, 2010.

Weaver et al. "Game-theoretic Control of Small Scale Power Systems," IEEE Transactions on Power Delivery, vol. 24, No. 3, pp. 1560-1567, Jul. 1, 2009.

* cited by examiner

100

200

300

400

500

600

700

800

METHOD FOR DETERMINING POWER CONSUMPTION OF LOADS IN UNGROUNDED POWER DISTRIBUTION SYSTEMS

FIELD OF THE INVENTION

The present invention relates generally to power distribution systems, and more particularly to determining power consumption of loads in ungrounded power distribution systems.

BACKGROUND OF THE INVENTION

Ungrounded power distribution systems are widely used, especially at medium voltage levels, e.g., less than 50 kV. The ungrounded power distribution system is a three-phase three-wire system. The windings of three-phase transformers within the system use either ungrounded WYE or DELTA connection, and three-phase loads are DELTA connected.

For a number of applications, it is necessary to determine the power consumption of loads at an instant of time, because load profiles may not accurately represent the current power consumption. For example, one of the frequently occurred faults in the power distribution system includes a single-phase-to-ground short circuit fault. For a grounded distribution system, the fault currents are usually greater than the load currents, so the impacts of loads can be ignored when determining the location of the fault. However, for an ungrounded distribution systems, the fault currents are usually less than the load currents, therefore the accuracy of the determination of the location of the fault depends on the accuracy of determination of the power consumption of the loads.

Several methods have been used for estimating loads in ungrounded distribution systems. For example, a method of load forecasting for a present day described in US 20120221158 A1 includes obtaining past observed load values of at least three earlier days and identifying a relationship between the present day's load forecast and the past observed load values including unknown weights associated with the past observed load values. Another method described in U.S. Pat. No. 7,979,222 employed load profiles in combination with short-term load estimations to forecast expected loads on a distribution network. The predicted loads may then be used by power restoration controllers when performing back-feed capacity checks.

All those methods have limitations either in processing time or estimation accuracy when applied to real time applications in the ungrounded power distribution systems.

SUMMARY OF THE INVENTION

Various embodiments of the invention provide a system and a method for determining power consumption of a load in a feeder section of an ungrounded power distribution system. Some embodiments are based on a realization that the power consumption can be first determined based on a load profile of the load and later adjusted based on a mismatch of target active powers determined based on measurements at an importing measuring device of the feeder section and active powers determined based on the estimated power consumption. Some embodiments perform adjustment of the power consumption iteratively, until a difference between the active and the target active powers is less than a threshold.

Accordingly, one embodiment discloses a method for determining power consumption of a load in a feeder section of an ungrounded power distribution system, wherein the ungrounded power distribution system includes a set of feeder sections connected to a substation, wherein each feeder section includes a set of loads connected by line segments, wherein borders of a line segment are defined by a pair of buses, wherein borders of the feeder section are defined by an importing measuring device connecting the feeder section with an upstream feeder section or the substation, and by at least one exporting measuring device connecting the feeder section with a downstream feeder section, wherein the importing and exporting measuring devices are equipped with measuring units. The method includes representing a power consumption of each load in the feeder section as a product of a scaling factor and a base power defined by a load profile of the load; solving a power flow of the feeder section using the power consumptions of the loads by treating buses connected with the importing measuring device as a constant voltage bus and buses connected with the exporting measuring devices as a constant power bus to produce an active power for each phase of the importing measuring device; determining a target active power for each phase of the importing measuring device using measurements at the importing device; and updating the scaling factors based on a difference between the active power and the target active power of the importing device, wherein steps of the method are performed by a processor.

Some embodiments are based on a realization that target active power measured during the fault should be adjusted with shunt currents of each line segment of the feeder section when the measurements during a single-phase-to-ground fault are used. Accordingly, one embodiment determine the shunt currents of the line segments based on a shunt admittance of a line segment and voltages of buses defining the line segment, and removes contribution of the shunt current resulting from a single-phase-to-ground fault in determining the target active power.

Some embodiments based on another realization that due to the DELTA connection of the loads, the power consumption of the loads should be adjusted based on phase-to-phase powers. However, the measurements of some ungrounded power distribution system are provided in terms of phase or phase-to-ground based components. Accordingly, some embodiments transform components of the phase based active or target active powers to determined phase-to-phase difference between the active and target active powers. For example, one embodiment uses a WYE-DELTA transformation of equivalent resistances of active powers to determine the phase-to-phase difference. Another embodiment determine the phase-to-phase difference using incremental phase-to-phase currents which determined by the current mismatches for each phase determined at importing measuring device of the feeder section.

Accordingly, one embodiment of the invention discloses a method for determining power consumption of a load in a feeder section of an ungrounded power distribution system, wherein the ungrounded power distribution system includes a set of feeder sections connected to a feeder, wherein each feeder section includes a set of loads connected by line segments, wherein borders of a line segment are defined by a pair of buses, wherein borders of the feeder section are defined by an importing device connecting the feeder section to an upstream feeder section or the substation, and by at least one exporting device connecting the feeder section with a downstream feeder section.

The method includes representing a power consumption of each load in the feeder section as a product of a scaling factor and a base power defined by a load profile of the load; solving a power flow of the feeder section using the power consumptions of the loads by treating the buses of importing device as a constant voltage bus and the buses of exporting devices as a constant power bus to produce an active power for each phase of the importing device; determining a target active power for each phase of the importing device using measurements at the importing device; and updating the scaling factors based on a difference between the active power and the target active power of the importing device. Steps of the method can be performed by a processor.

Another embodiments discloses a system for determining power consumption of a load in a feeder section of an ungrounded power distribution system, wherein the ungrounded power distribution system includes a set of feeder sections connected to a feeder, wherein each feeder section includes a set of loads connected by line segments, wherein borders of a line segment are defined by a pair of buses, wherein borders of the feeder section are defined by an importing device connecting the feeder section with an upstream feeder section, and by at least one exporting device connecting the feeder section with a downstream feeder section The system includes a processor for representing a power consumption of each load in the feeder section as a product of a scaling factor and a base power defined by a load profile of the load; solving a power flow of the feeder section using the power consumptions of the loads by treating the importing device as a constant voltage bus and the exporting device as a constant power bus to produce an active power for each phase of the importing device; determining a target active power for each phase of the importing device using measurements at the importing device; and updating the scaling factors based on a difference between the active power and the target active power of the importing device to determine the power consumption of the load.

DETAILED DESCRIPTION OF THE PREFERRED EMBODIMENTS

Ungrounded Distribution System and Load Estimation

Figure 1:
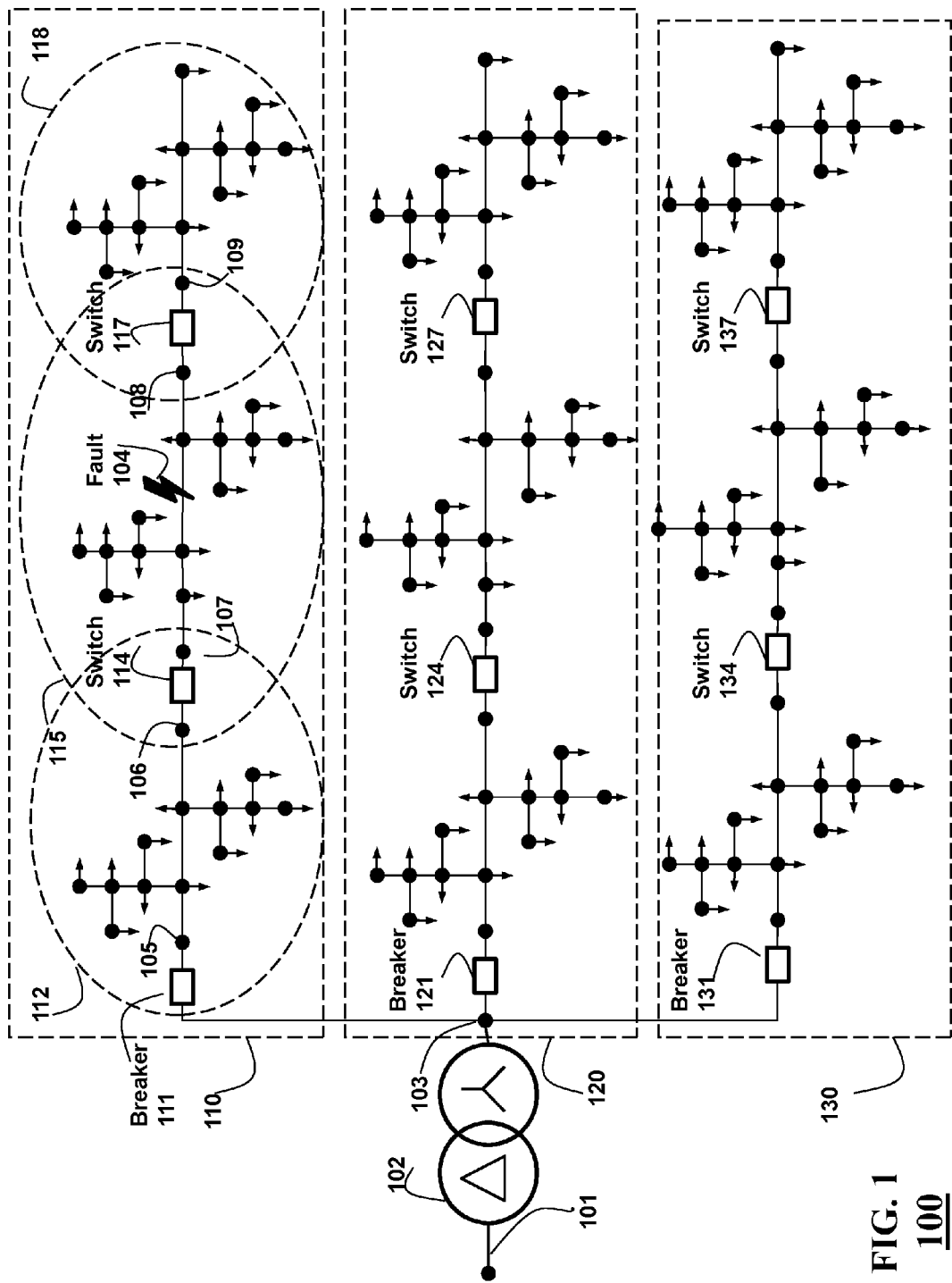
FIG. 1 is a schematic of an exemplar ungrounded distribution system employed by some embodiments of the invention.

FIG. 1 shows an example of an ungrounded distribution system 100 with a single-phase-to-ground fault 104. A distribution system 100 includes a distribution substation in which a three-phase transformer 102 receives electric power from a transmission system, and provides the power for downstream feeders through an upstream bus 101 and a downstream bus 103 connected to the transformer 102.

The windings of the transformer 102 are ungrounded, either using ungrounded WYE or DELTA connection. For example, in the FIG. 1, the primary winding of the transformer uses the DELTA connection, and secondary winding uses the ungrounded WYE connection. The feeder transfers powers to the loads through three-phase three-wire lines. All loads can be DELTA connected. Each feeder can have several switchable and measured devices, and the measuring units attached to the devices can provide three phase-to-ground voltage and three phase current measurements.

In the example of FIG. 1, the transformer 102 is connected to three feeders, a feeder 110, a feeder 120 and a feeder 130. Each feeder can include one feeder breaker at its root, e.g., breakers 111, 121, and 131. The feeders can also include switches defining sections of the feeders. For example, the feeder 110 includes a switch 114 and a switch 117. The feeder 120 includes a switch 124 and a switch 127. The feeder 130 includes a switch 134 and a switch 137. The switchers can include sensors for measuring voltages, currents or both.

Distribution networks are typically of two types, radial or interconnected. The distribution system 100 operates radially, i.e., power is distributed by the substation, and passes through the network area with no connection to any other power supply.

According to the location of switchable and measured devices, a feeder can be partitioned into several feeder sections. Each feeder section can have one importing measuring device at the root of the section for providing power to this section, and several exporting measuring devices at the downstream boundaries of the section for providing power to subsequent feeder sections. All line segments or devices between the importing and the exporting measuring devices are part of the feeder section.

For example, the feeder 110 can be partitioned into three feeder sections, section 112, section 115, and section 118. The feeder section 112 includes all the line segments or devices between the upstream bus 103 of breaker 111, and upstream bus 106 of switch 114, and includes one importing measuring device located at breaker 111 and connecting the feeder section with the substation or an upstream feeder section, and at least one exporting measuring device, e.g., located at switch 114, and connecting the feeder section with a downstream feeder section. The section 115 is defined by all the line segments or devices between the upstream bus 106 of switch 114, and upstream bus 108 of switch 117, and includes one importing measuring device located at switch 114, and one exporting measuring device located at switch 117. The feeder section 118 is defined as all line segments or devices downstream to the upstream bus 108 of switch 119, and includes one importing measuring device located at switch 117. Feeder section 118 does not have any exporting measuring device.

The measurements used by some embodiments are steady-state power frequency components of voltage and current measurements. Each measurement can be described by a magnitude, and a phase angle. If the instantaneous waveforms are provided instead of steady-state values at power frequency, a least-square regression method can be applied to extract the required power frequency components from the instantaneous voltage and current measurements. The measurements collected from the measuring units of a breaker or switch with sensor include the currents flowing downstream on phase a, b and c, $I_{ps,a}$, $I_{ps,b}$ and $I_{ps,c}$, and the phase-to-ground voltages on phase a, b and c, $V_{p,a}$, $V_{p,b}$ and $V_{p,c}$, where bus p and s are the terminal buses of the breaker or switch, and bus p is upstream to bus s.

For example, for the breaker 111, the measurements can include three phase-to-ground voltages measured at the upstream bus 103, and three-phase currents flowing through the breaker from the upstream bus 103 towards a downstream bus 105.

Figure 2:
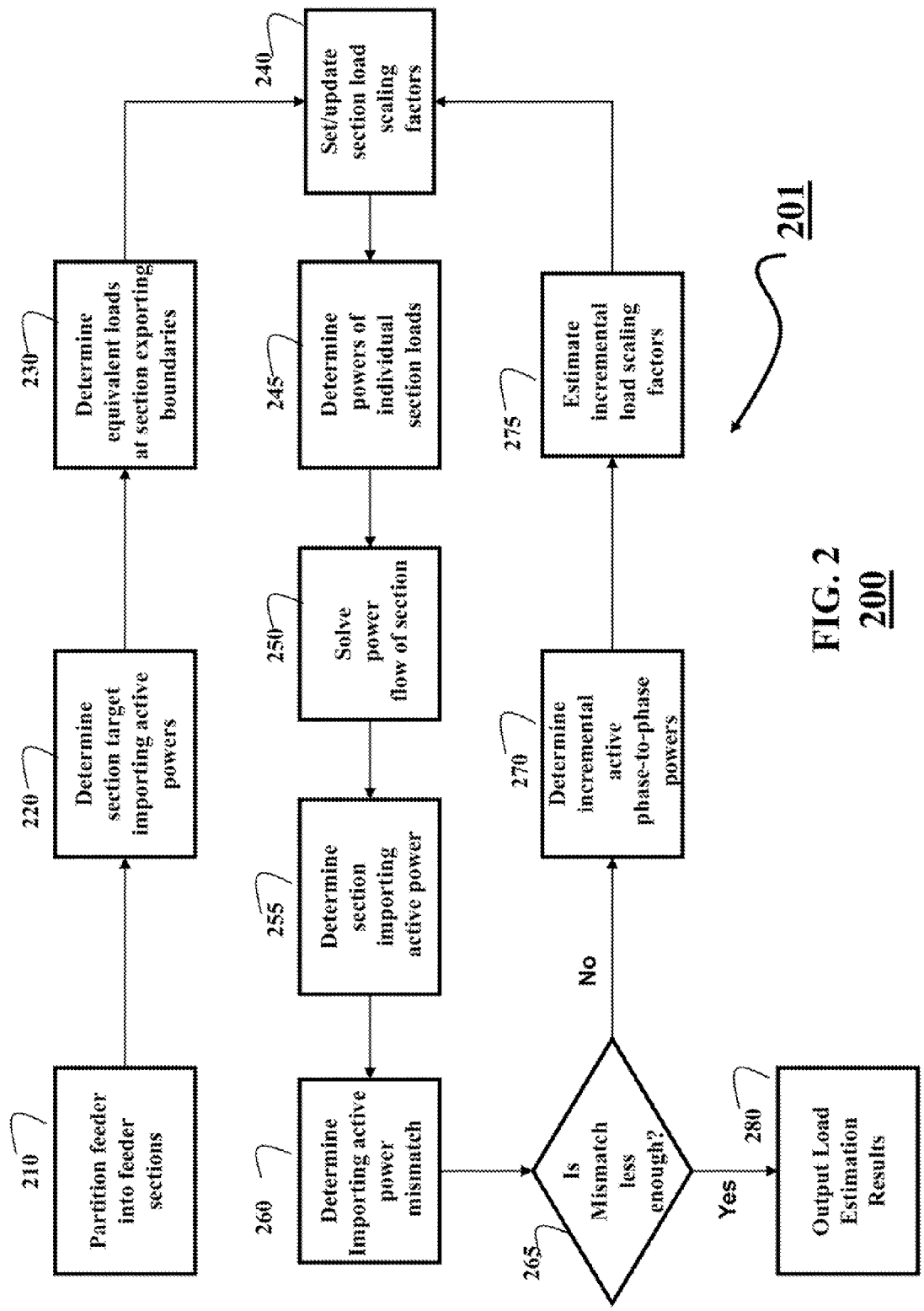
FIG. 2 is a block diagram of a method for determining loads of ungrounded distribution systems according to some embodiments of invention.

FIG. 2 shows a method 200 for determining loads of ungrounded systems according to some embodiments of invention. The steps of the method can be implemented by a processor 201.

In step 210, a feeder in an ungrounded distribution system is partitioned into a set of feeder sections according to the measuring devices along the feeder. The loads of each feeder section are determined independently.

In step 220, a set of target active powers at the importing device are determined per phase based on the measurements at the device. If the ungrounded distribution system has a fault, then in one embodiment, the impacts of the fault are removed from the measurements, as described in connection with FIG. 5.

In step 230, the powers of equivalent loads at the exporting measuring devices that supplied powers to the downstream sections are determined based on the measurements at the exporting devices of the feeder section.

In step 240, the scaling factors for DELTA-connected loads for the feeder section are initialized for a first iteration, and updated with incremental changes determined in step 275.

In step 245, the powers of each individual load are determined as a product of load scaling factors for the feeder section, and base powers defined by load profiles of the individual load.

In step 250, a power flow is solved for the feeder section by assigning one of buses connected with importing measuring device of the section as a constant voltage bus, buses connected with the exporting measuring devices and loads as constant power buses. The voltages of importing measuring device are set based on the voltage measurements at the importing device.

In step 255, a set of active powers at the importing measuring device for each phase are determined based on the solution of the power flow determined in step 250.

In step 260, a set of active power mismatches at the importing measuring device for each phase are determined as a difference between the target active powers determined in step 220, and active powers determined in step 255.

In step 265 the active power mismatches are compared with a predetermined threshold. If the mismatch is less than the threshold or a predetermined number of iterations are reached, the method outputs the results 280. Otherwise, the method performs steps 270 and 275.

Figure 3:
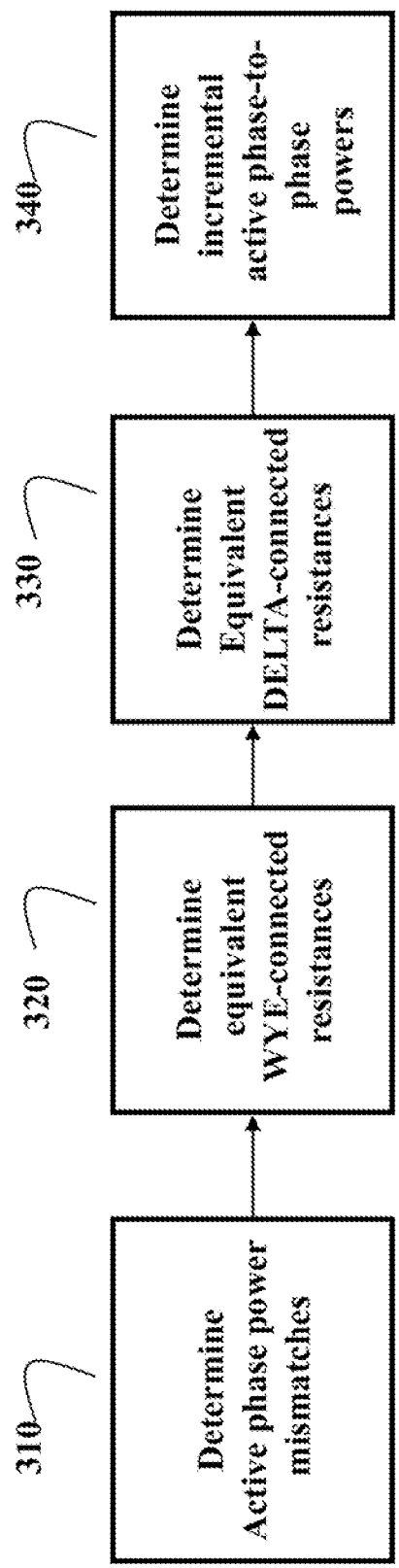
FIG. 3 is a block diagram of a method for determining incremental scaling factors for DELTA-connected loads based on the active phase power mismatches at the importing measuring device of the feeder section through equivalent resistance transformation according to some embodiments of invention.
Figure 4:
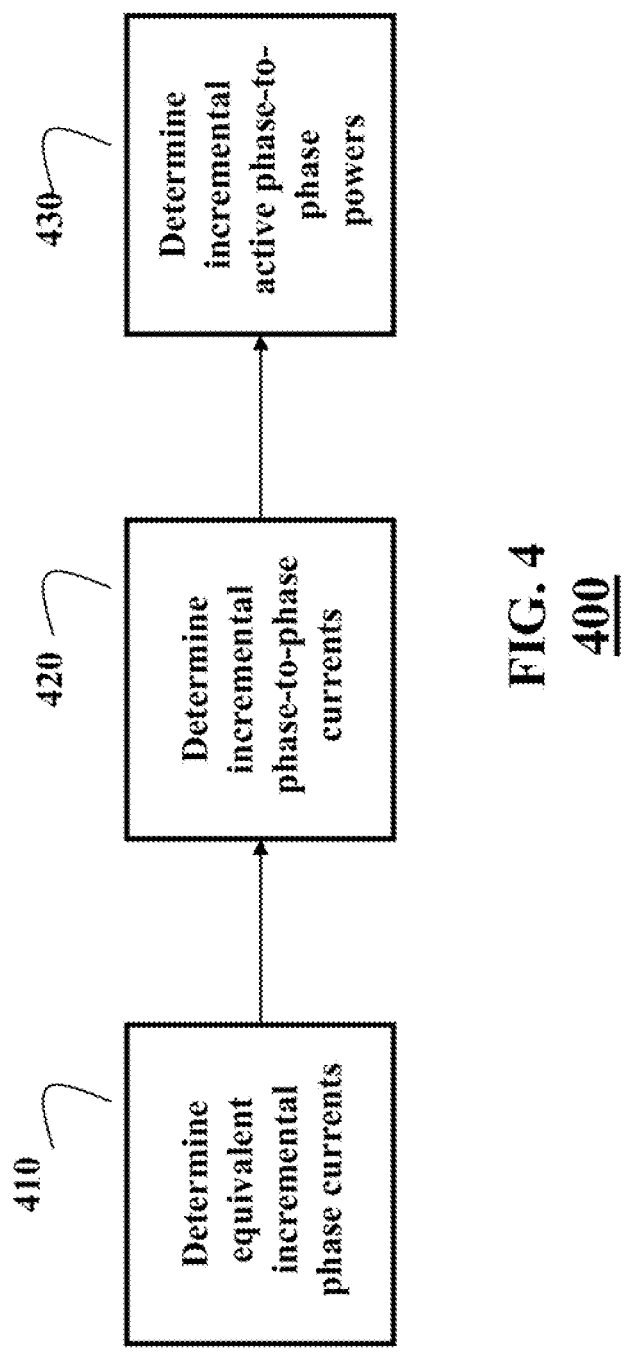
FIG. 4 is a block diagram of a method for determining incremental scaling factors for DELTA-connected loads based on the active phase power mismatches at the importing measuring device of the section through equivalent current transformation according to some embodiments of invention.

In step 270, a set of incremental active phase-to-phase powers are determined based on the set of active power mismatches per phase determined in step 260 through equivalent resistance transformation, see FIG. 3, or equivalent current transformation, see FIG. 4.

In step 275, a set of incremental scaling factors for DELTA-connected loads in the feeder section is determined based on the incremental phase-to-phase powers determined in step 270, and the load profiles for the loads in the section.

Step 280 outputs the power consumption of the loads in the feeder sections.

Determining Loads of a Feeder Section Using Pre-Fault Measurements

The loads in the feeder section can include fixed loads and scalable loads. The fixed loads refer to the equivalent loads consumed by downstream feeder sections connected to the feeder section through the exporting measuring devices. For an exporting measuring device, the equivalent WYE-connected power demands can be determined using the phase-to-ground voltage and phase current measurements at the measuring device:

$$S_{ex_i,x} = V_{ex_i,x} I^*_{ex_i,x} \; x \in \{a,b,c\} \quad (1)$$

where, $S_{ex_i,x}$ is the equivalent complex power at measuring device $ex_i$ on phase x, $V_{ex_i,x}$ and $I_{ex_i,x}$ are the voltage and current of phase x measured at the measuring device $ex_i$.

The scalable loads can refer to individual loads in the feeder section, which can be DELTA-connected. The complex powers of individual loads can be defined as:

$$S_{p,xy} = \alpha_{p,xy} S_{p,xy}^{base} \; xy \in \{ab,bc,ca\} \quad (2)$$

where, $S_{p,xy}$ is the complex power of a load component between phase x and phase y at bus p, $S_{p,xy}^{base}$ is the initial complex power given by load profile for the time interval of interest, e.g., a time interval for fault, $\alpha_{p,xy}$ is the scaling factor for a load component between phase x and phase y.

A load profile for a load is created using historical measurements of the customers' electricity use at regular intervals, typically 15 minutes or less, and provides an accurate representation of customers' usage pattern over time.

One embodiment determines the values of the vector of scaling factors $\alpha_{p,xy}$ for the time of interest, e.g., when the fault occurs for each individual loads based on available measurements. Each load is associated with the scaling factors. One embodiments uses a set of uniform scaling factors, such that individual loads between phase x and y use the same scaling factor $\alpha_{xy}$ to determine power consumption of the loads. Alternative embodiment determines the scaling factors based on the steady state voltage and current measurements measured before or during the fault.

The scaling factors for the feeder section can be determined using the measurements at the importing and exporting measuring devices of the feeder section. Some embodiments determine the scaling factors iteratively. For example, the scaling factors are initialized with a set of initial values and the power consumptions are determined for each individual load. The buses of individual loads and upstream buses of exporting measuring devices are treated as constant active power and reactive power buses, i.e., PQ buses. The upstream buses of the importing measuring devices are treated as a constant voltage magnitude and phase angle bus, i.e., a swing bus.

The voltages of the swing bus are set as the measured voltages at the importing measuring device. Various power flow method, such as a backward/forward sweep method described by William H. Kersting in "Distribution System Modeling and Analysis" (ISBN 0-8493-5806-X), CRC Press, New York, 2007, pp. 323-353, can be used to solve the power flows of the feeder section. Based on the solved power flow results, a determined active power at the importing measuring device is determined according to:

$$P_{im,x}^{calculated} = |V_{im,x}||I_{im,x}^{calculated}|\cos(\angle V_{im,x} - \angle I_{im,x}^{calculated})\ x\in\{a,b,c\} \quad (3)$$

where, $P_{im,x}^{calculated}$ is the determined active power on phase x at the importing measuring device, $|V_{im,x}|$ and $\angle V_{im,x}$ are the magnitude and phase angle of phase-to-ground voltage on phase x measured at the importing measuring device, $|I_{im,x}^{calculated}|$ and $\angle I_{im,x}^{calculated}$ are the magnitude and phase angle of determined phase current on phase x through the importing measuring device into the feeder section.

Some determining a target active power for each phase of the importing device using measurements at the importing device according to:

$$P_{im,x} = |V_{im,x}||I_{im,x}|\cos(\angle V_{im,x} - \angle I_{im,x})\ x\in\{a,b,c\} \quad (4)$$

where, $P_{im,x}$ is the target active power on phase x at the importing device, $|I_{im,x}|$ and $\angle I_{im,x}$ are the magnitude and phase angle of phase current on phase x measured at the importing device.

If the determined active powers and the target power active powers for all phases are similar, then the current set of scaling factors is the final solution. For example, one embodiment compares the difference between active powers and the target power with a threshold according to $$|P_{im,x}^{calculated} - P_{im,x}| \le \epsilon\ x\in\{a,b,c\} \quad (5)$$

An example of the threshold $\epsilon$ is 0.00001. If the condition expressed in Equation (5) is not met, then the scaling factors are adjusted iteratively until the difference is below threshold.

Various embodiments use at least two different methods to adjust the scaling factors of the feeder section. One method is the incremental equivalent resistance based approach, and the other method is the incremental current based approach.

Adjusting Scaling Factors Based on Incremental Equivalent Resistances

One embodiment uses the active power mismatch at importing device to determine equivalent WYE-connected incremental resistances for all three phase at the importing device, and then convert the WYE-connected incremental resistances into DELTA-connected incremental resistances, and based on those DELTA-connected incremental resistances, determines set of incremental phase-to-phase active powers. The required incremental scaling factors are determined based on the incremental phase-to-phase active powers and values provided by the load profiles.

FIG. 3 shows a block diagram of a method for transforming phase power difference through equivalent resistance conversion to determined phase-to-phase difference between the active and target active powers according to one embodiment of the invention. For example, this embodiment can use the incremental equivalent resistance based approach for determining incremental phase-to-phase active powers based on active phase power mismatches. Step 310 determines the active power mismatch for each phase at the importing measuring device. In step 320, a set of equivalent WYE-connected resistances are determined based on the active power mismatches determined in step 310, and phase-to-ground voltages measured at the importing device. In step 330, using WYE-DELTA transformation of resistances, a set of equivalent DELTA-connected resistances are determined, and step 340 determines the incremental active phase-to-phase powers based on the equivalent resistances given by step 330, and the phase-to-phases voltages determined based on voltages measured at the importing device.

In some embodiments, the active power mismatches for each phase at the importing measuring device are determines according to $$\Delta P_{im,x} = P_{im,x} - P_{im,x}^{calculated},\ x\in\{a,b,c\} \quad (6)$$

where $\Delta P_{im,x}$ is the active power mismatch of phase x at the importing measuring device. The equivalent WYE-connected resistances can be determined as:

$$\Delta R_{im,x} = |V_{im,x}|^2/\Delta P_{im,x},\ x\in\{a,b,c\} \quad (7)$$

where $\Delta R_{im,x}$ is the equivalent resistance for phase x at the importing device. Using the WYE-DELTA transformation of resistances, a set of DELTA-connected equivalent resistances can be determined according to:

$$\Delta R_{im,ab} = \frac{\Delta R_{im,a}\Delta R_{im,b} + \Delta R_{im,b}\Delta R_{im,c} + \Delta R_{im,c}\Delta R_{im,a}}{\Delta R_{im,c}}, \quad (8)$$

$$\Delta R_{im,bc} = \frac{\Delta R_{im,a}\Delta R_{im,b} + \Delta R_{im,b}\Delta R_{im,c} + \Delta R_{im,c}\Delta R_{im,a}}{\Delta R_{im,a}}, \quad (9)$$

$$\Delta R_{im,ca} = \frac{\Delta R_{im,a}\Delta R_{im,b} + \Delta R_{im,b}\Delta R_{im,c} + \Delta R_{im,c}\Delta R_{im,a}}{\Delta R_{im,b}}, \text{ and} \quad (10)$$

where $\Delta R_{im,ab}$, $\Delta R_{im,bc}$ and $\Delta R_{im,ca}$ are the equivalent DELTA-connected resistances between phase a and b, b and c, c and a respectively. Based on these DELTA-connected resistances, the corresponding incremental active phase-to-phase powers are determined as:

$$\Delta P_{im,xy} = \frac{|V_{im,xy}|^2}{\Delta R_{im,xy}},\ x \in \{a,b,c\} \quad (11)$$

where $\Delta P_{im,xy}$ are the required incremental active powers between phase x to phase y, and $|V_{im,xy}|$ are the magnitude of phase-to-phase voltages between phase x to phase y.

Combing Eq. (6)-(11), the incremental phase active powers are converted into incremental phase-to-phase active powers according to:

$$\Delta P_{im,xy} = \frac{|V_{im,xy}|^2|V_{im,z}|^2}{\Delta P_{im,z}\sum_{xi\in\{ab,bc,ca\}}(|V_{im,s}|^2|V_{im,t}|^2/\Delta P_{im,s}/\Delta P_{im,t})}, \quad (12)$$

$$(xy, z) \in \{(ab, c), (bc, a), (ca, b)\}$$

where $|V_{im,s}|$, $|V_{im,t}|$, $|V_{im,z}|$ are the magnitude of phase-to-ground voltage at phase s, phase t and phase z respectively, $\Delta P_{im,s}$, $\Delta P_{im,t}$ and $\Delta P_{im,z}$ are the active power mismatch at phase s, phase t and phase z, and phase z is different than phase x and y.

The required incremental scale factors can be determined according to:

$$\Delta \alpha_{xy} = \frac{\Delta P_{im,xy}}{\sum_{p\in LD} P_{p,xy}^{base}},\ xy \in \{ab, bc, ca\} \quad (13)$$

where $\Delta\alpha_{xy}$ is the required incremental scale factors for loads between phase x and y, $P_{p,xy}^{base}$ is the initial active power of load connected to bus p between phase x and y provided by the load profiles, LD is the set of load buses in the feeder section.

Adjusting Scaling Factors Based on Incremental Equivalent Currents

Another embodiment uses the solution of the power flow and current measurements to determine phase current mismatches at the importing measuring device for each phase, and determine incremental phase-to-phase currents based on the phase current mismatch. Those incremental phase-to-phase currents are used to determine a set of incremental phase-to-phase active powers. The incremental scaling factors are finally determined using the incremental phase-to-phase active powers and base values provided by the load profiles.

FIG. 4 shows a block diagram of a incremental equivalent current based method for determining incremental phase-to-phase active powers based on phase current mismatches, according another embodiment. This embodiment uses the solution of the power flow and current measurements to determine current mismatches at the importing measuring device for each phase, and determine incremental phase-to-phase currents based on the phase current mismatch. Those incremental currents are used to determine a set of incremental phase-to-phase active powers. The incremental scaling factors are finally determined using the incremental phase-to-phase active powers and base values provided by the load profiles.

Specifically, in step 410, the method determines the current mismatch for each phase at the importing measuring device. In some embodiments, the current mismatch for each phase at the importing measuring device is determined according to $$\Delta I_{im,x} = I_{im,x} - I_{im,x}^{calculated} \quad x \in \{a,b,c\}, \tag{14}$$

wherein $\Delta I_{im,x}$ is the mismatch of current at the phase x at the importing measuring device, a target current $I_{im,x}$ is measured at the importing measuring device, and the current $I_{im,x}^{calculated}$ is determined by the power flow.

In step 420, a set of incremental phase-to-phase currents are determined based on the phase current mismatches. For example, the incremental phase-to-phase currents can be determined according to $$\Delta I_{im,xy} = \frac{\Delta I_{im,x} - \Delta I_{im,y}}{2} \quad xy \in \{ab, bc, ca\}, \tag{15}$$

wherein $\Delta I_{im,xy}$ is the incremental current between a phase x and a phase y at the importing device In step 430, the incremental active phase-to-phase powers are determined based on the equivalent incremental phase-to-phase currents and phase-to-phase voltages determined based on the voltages measured at the importing measuring device. For example, the incremental active phase-to-phase power can be determined according to $$\Delta P_{im,xy} = |V_{im,xy}||\Delta I_{im,xy}|\cos\left[\angle V_{im,xy} - \angle(\Delta I_{im,xy})\right], \quad xy \in \{ab,bc,ca\}, \tag{16}$$

wherein $\Delta P_{im,xy}$ is the incremental active phase-to-phase power between phase x and y at the importing device, $|\Delta I_{im,xy}|$ and $\angle(\Delta I_{im,xy})$ are a magnitude and a phase angle of incremental phase-to-phase current between the phase x and the phase y at the importing device. Next, Equation (13) can be used to determine the required incremental scaling factors.

Determining Loads of a Feeder Section Using Measurements During the Fault

The scaling factors for the feeder section can also be iteratively determined using the measurements during the fault provided by importing and exporting devices. The buses of individual loads and upstream buses of exporting measuring devices are treated as PQ buses, and the equivalent power demands of exporting devices are determined using Equation (1) with voltage and current measured during the fault. The upstream bus of importing device is treated as a swing bus, and its magnitude and a phase angle of phase-to-ground voltages are set as measured values during the fault.

As described above, the power flow analysis determines the active powers. The target active powers are determined based on the measurements at the importing measuring device. However, in this embodiment, the target active powers are determined differently, for a feeder section having a fault, and for a feeder section without a fault.

Specifically, for a feeder section without a fault, Eq. (4) is used to determine the target active powers at the importing measuring device with the phase-to-ground voltages and phase currents measured. Accordingly, the incremental scaling factors of a feeder section without a fault can be determined by using either incremental equivalent resistance based method, or incremental equivalent current based approach.

For a feeder section having a fault, the fault currents are flowing into the section and entered into the ground. The phase currents measured at the importing devices are contributed from two aspects. One aspect is the load demands used to determine the scaling factors. The other aspect is the impacts of the single-line-to-ground fault within the section that is not used for scaling factor determination. Due to the short circuit in the feeder section, the phase current at the faulty phase includes the components serving the loads downstream, and the components contributed from the shunt capacitors of the faulty feeder and adjacent un-faulty feeders that connected to the same transformer as the faulty feeder.

Considering the impacts of short circuit in the feeder section, the target phase powers are determined differently for a faulty phase and an un-faulty phase. For the un-faulty phase x, the target active power, $P_{im,x}$ is determined by directly using the voltage and current measurements during the fault using Equation (4). For a faulty phase x, the target power is determined according to:

$$P_{im,x} = |V_{im,x}||\hat{I}_{im,x}|\cos(\angle V_{im,x} - \angle\hat{I}_{im,x}), \tag{17}$$

where $\hat{I}_{im,x}$ is the determined phase current on phase x, defined as the phase current measurement with a subtraction of shunt currents resulting from a single-phase-to-ground fault:

$$\hat{I}_{im,x} = I_{im,x} - TI_{im} + I_{im}^{shunt}, \tag{18}$$

where $I_{im}$ is the vector of phase currents measured at the importing measuring device during the fault, $I_{im,x}$ is the measured current on the faulty phase x at the importing device, T=[1 1 1], and $I_{im}^{shunt}$ is the shunt current resulting from all line segments downstream to the importing measuring device. The shunt currents $I_{im}^{shunt}$ is determined based on the shunt admittances of line segments, and voltages of terminal bus voltages of line segments. The determination of bus voltage and shunt currents is described in the next section.

Figure 5:
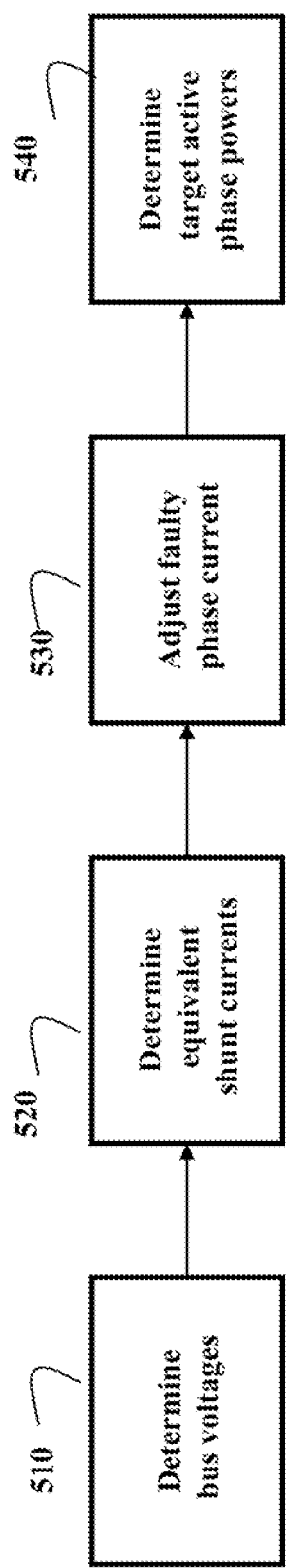
FIG. 5 is a block diagram of a method for determining target active powers of a feeder section having a fault according to some embodiments of invention.

FIG. 5 shows a block diagram of a method for determining target active powers of a feeder section having a fault. In step 510, the voltages of all buses downstream to the importing measuring device are determined based on the voltage measurements at the boundaries of the feeder section. In step 520, the shunt currents at the importing device of the faulty section are calculated based on the shunt admittances of line segments and voltages of the buses. Step 530 adjusts the faulty phase current based on the measured currents and shunt currents determined in step 520. In step 540, the target active powers are determined using Eq. (17) for a faulty phase, and Eq. (4) for a phase without the fault.

The incremental scaling factors of the faulty feeder section can be determined by using either incremental equivalent resistance based method, or incremental equivalent current based approach.

In some embodiments using the equivalent current based method, the active current mismatches for the faulty and un-faulty phases are determined with different equations for target current. For a faulty phase x, Equation (18) is used, and for an un-faulty phase, the current measurement for the corresponding phase can be used directly. The incremental phase-to-phase currents are determined based on a set of equations defined according to the faulty phase.

If the faulty phase is phase a, the incremental phase-to-phase currents are determined according to:

$$\Delta I_{im,ab} = -\Delta I_{im,b}, \tag{19}$$

$$\Delta I_{im,bc} = \frac{\Delta I_{im,b} - \Delta I_{im,c}}{2}, \tag{20}$$

and $$\Delta I_{im,ca} = \Delta I_{im,c}, \tag{21}$$

Similarly, if the faulty phase is phase b, then the incremental phase-to-phase currents are determined according to:

$$\Delta I_{im,ab} = \Delta I_{im,a}, \tag{22}$$

$$\Delta I_{im,bc} = -\Delta I_{im,c}, \tag{23}$$

and $$\Delta I_{im,ca} = \frac{\Delta I_{im,c} - \Delta I_{im,a}}{2}. \tag{24}$$

If the faulty phase is phase c, then the incremental phase-to-phase currents are determined according to:

$$\Delta I_{im,ab} = \frac{\Delta I_{im,a} - \Delta I_{im,b}}{2}, \tag{25}$$

$$\Delta I_{im,bc} = \Delta I_{im,b}, \tag{26}$$

and $$\Delta I_{im,ca} = -\Delta I_{im,a}. \tag{27}$$

Determining Shunt Currents of a Faulty Feeder Section

Figure 6:
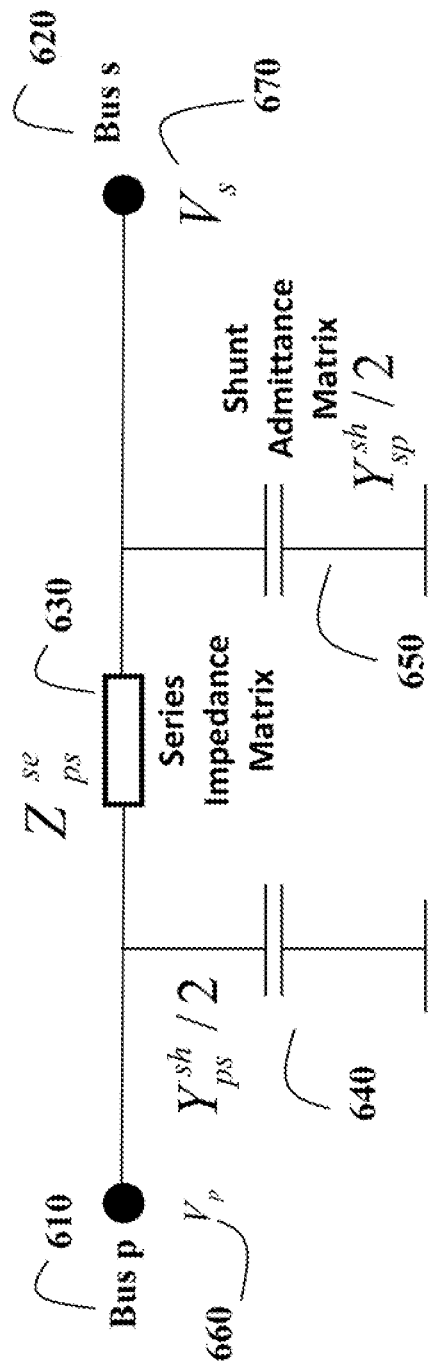
FIG. 6 is a schematic of a line segment with series impedance and shunt admittance according to some embodiments of invention.

The shunt currents of a faulty feeder section are determined based on the model of line segment shown in FIG. 6, and bus voltages are determined based on the voltage measurements during the fault.

FIG. 6 shows an example of a line segment between a upstream bus p and a downstream bus s, 620. The line segment is modeled by a series phase impedance matrix $Z_{ps}^{se}$ 630, and a shunt admittance matrix $Y_{ps}^{sh}$ split into two terminal buses, 640, and 650. The phase-to-ground voltages at bus p and bus s are represented by the vectors $V_p$, 660 and $V_s$, 670.

The shunt currents, $I_{im}^{shunt}$ in Eq. (18) is determined according to:

$$I_{im}^{shunt} = \sum_{ps \in DN_{im}} \frac{1}{2} T Y_{ps}^{sh}(V_p + V_s), \tag{28}$$

where $DN_{im}$ is the set of line segments downstream to the importing measuring device, and includes line segments within the faulty section, and all feeder sections downstream to the faulty section, bus p and bus s are two terminal buses of line segment, $Y_{ps}^{sh}$ is the shunt admittance matrix for a line segment between bus p and s, $V_p$ and $V_s$ are the phase-to-ground voltages of bus p and bus s.

The voltages of buses are determined section by section. The voltages of a feeder section are determined based on the phase voltage measurements at the importing and exporting measuring devices of the section.

Figure 7:
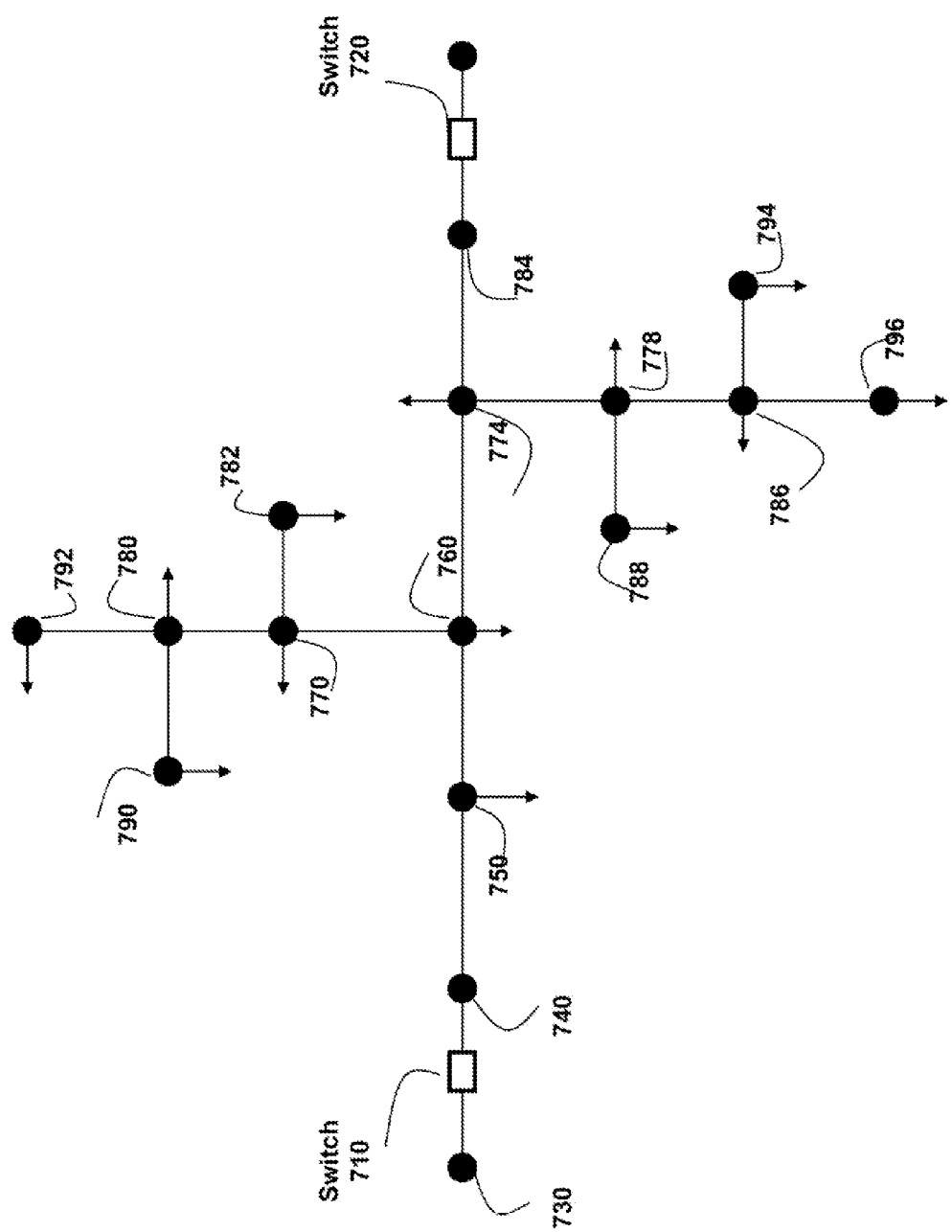
FIG. 7 is a schematic of a feeder section with an importing measuring device, and an exporting measuring device according to some embodiments of invention.
Figure 8:
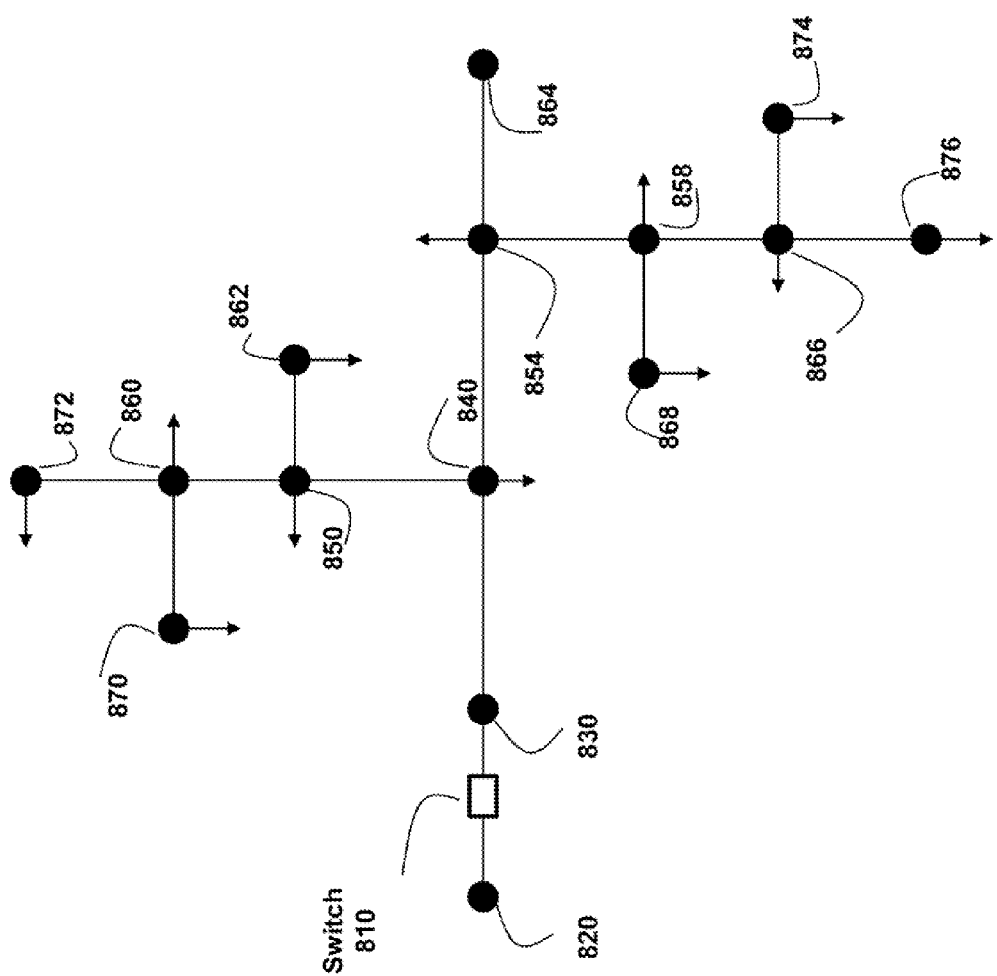
FIG. 8 is a schematic of a feeder section with only an importing measuring device according to some embodiments of invention.

FIG. 7 and FIG. 8 show two examples of feeder sections with different measuring conditions. FIG. 7 is a schematic of a feeder section 700 that has multiple measuring devices at its boundaries. The feeder section 700 has one importing measuring device at switch 710, and one exporting measuring device at switch 720. FIG. 8 is a schematic of a feeder section 800 that has only one measuring device, importing measuring device at switch 810.

For a feeder section with multiple measuring devices, the connectivity path between each pair of the importing measuring device and at least one of the exporting measuring devices is determined. For any bus in the path, the phase-to-ground voltages of the bus are determined based on distances from the bus to two measuring devices and available voltage measurements at the two measuring devices.

The phase-to-ground voltage of bus p can be determined according to:

$$V_p = \frac{d_{p-ex}}{d_{im-p} + d_{p-ex}} V_{im} + \frac{d_{im-p}}{d_{im-p} + d_{p-ex}} V_{ex}, \tag{29}$$

where $V_p$ is the vector of determined phase-to-ground voltages of bus p, $V_{im}$ and $V_{ex}$ are the vectors of phase-to-ground voltages measured at the importing device im and exporting measuring device ex, $d_{im-p}$ and $d_{im-ex}$ are the sum of length of line segments residing at the path between importing measuring device im to exporting measuring device ex, respectively.

If there are multiple exporting measuring devices, and common buses between different paths, then the voltages of those common buses are set as an average of determined voltages for all paths according to $$V_p = \frac{1}{m} \sum_{i=1}^{m} \left( \frac{d_{p-ex_i}}{d_{im-p} + d_{p-ex_i}} V_{im} + \frac{d_{im-p}}{d_{im-p} + d_{p-ex_i}} V_{ex_i} \right), \tag{30}$$

where m is the total number of paths that pass through bus p, $ex_i$, is the exporting measuring device of the i-th path, $V_{ex_i}$ is the measured voltage of exporting measuring device $ex_i$, and $d_{p\text{-}ex_i}$ is the sum of length of line segments in the path between importing measuring device im to exporting measuring device $ex_i$.

A voltage of a bus not directly located on the path between the measuring devices, but fed from one of buses in that path, can be determined as the voltage of the feeding bus on the path according to:

$$V_s = V_p \quad (31)$$

where bus s is a bus not in the paths, bus p is a bus in the paths, $V_s$ is vector of the determined phase-to-ground voltages of bus s.

The feeder section shown in FIG. 7 has one importing measuring device 710 connected with bus 730, and one exporting measuring device 720 connected with bus 784. All buses in the path between the importing and exporting measuring devices, such as buses 740, 750, 760 and 774 are determined based on corresponding distances to the buses 730 and 784 and measured voltages at the buses 730 and 784 according to Equation (29).

The voltages of the buses downstream bus 760 and fed by the bus 760, including buses 770, 780, 782, 790, 792 are set as the same as the determined voltage of bus 760. The voltages of all buses downstream bus 774, including buses 778, 786, 788, 794, and 796 are set as the same as the determined voltage of bus 774.

For a feeder section with only one importing measuring device, all buses within the section are set as the measured voltages at the importing measuring device. Taking FIG. 8 as example, the feeder section has only one importing measuring device 810 connected with bus 820, the voltages of all buses in the section are set as the same as the voltages measured at bus 820.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

The terms "program" or "software" are used herein in a generic sense to refer to any type of computer code or set of computer-executable instructions that can be employed to program a computer or other processor to implement various aspects of the present invention as discussed above.

Computer-executable instructions may be in many forms, such as program modules, executed by one or more computers or other devices. Generally, program modules include routines, programs, objects, components, data structures that perform particular tasks or implement particular abstract data types. Typically the functionality of the program modules may be combined or distributed as desired in various embodiments.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described with reference to certain preferred embodiments, it is to be understood that various other adaptations and modifications can be made within the spirit and scope of the invention. Therefore, it is the object of the append claims to cover all such variations and modifications as come within the true spirit and scope of the invention.

I claim:

1. A method for determining power consumption of a load of an ungrounded power distribution system for monitoring power distribution system operations, the ungrounded power distribution system connects with a main grid through transformers with ungrounded winding connections, wherein downstream of the transformers are a multitude of ungrounded feeders, each ungrounded feeder includes a set of ungrounded feeder sections, and each ungrounded feeder section includes at least one pair of buses connected by line segments, such that each bus includes two or more phases and at least one bus includes a load connected between at least two phases of the at least one bus, wherein each ungrounded feeder section is defined by an importing device connecting the ungrounded feeder section to an upstream ungrounded feeder section within the ungrounded feeder, and by at least one exporting device connecting the ungrounded feeder section with a downstream feeder section within the ungrounded feeder, the method comprising:
a processor coupled to a data storage memory unit, the processor configured to perform the steps of:
determining a power consumption of each load of at least one bus connected between at least two phases of the at least one bus of each ungrounded feeder section of each ungrounded feeder of the multitude of ungrounded feeders, the power consumption for each load is a product of:
a scaling factor for each load connected between two phases, and
a base power defined by a load profile of the load;
solving a power flow of the ungrounded feeder section using the power consumptions of the loads by treating the buses of importing device as a constant voltage bus and the buses of exporting devices as a constant power bus to produce an active power for each phase of the importing device;
determining a target active power for each phase of the importing device using measurements of voltage and current for each phase at the importing device; and
updating the scaling factors based on a difference between the active power for each phase of the importing device and the target active power for each phase of the importing device, wherein determining the power consumption of loads in the ungrounded power distribution system assists in monitoring operations of the power distribution system.

2. The method of claim 1, wherein the target active power for each phase of the importing device $P_{im,x}$ on the phase x at the importing device is determined according to $$P_{im,x} = |V_{im,x}||\hat{I}_{im,x}|\cos(\angle V_{im,x} - \angle \hat{I}_{im,x}),$$

wherein, $|V_{im,x}|$ and $\angle V_{im,x}$ are a magnitude and a phase angle of a phase-to-ground voltage on the phase x measured at the importing device, wherein $\hat{I}_{im,x}$ is a phase current on the phase x with removed contribution of a shunt current resulting from a single-phase-to-ground fault on the phase x determined according to $$\hat{I}_{im,x} = I_{im,x} - TI_{im} + I_{im}^{shunt},$$

where $I_{im}$ is a vector of phase currents measured at the importing device during the fault, T=[1 1 1], and $I_{im}^{shunt}$ is the shunt current.

3. The method of claim 2, further comprising:
determining the shunt current as a sum of shunt currents of the line segments downstream importing device determined based on a shunt admittance matrix of each line segment.

4. The method of claim 3, wherein the shunt current is determined based on $$I_{im}^{shunt} = \sum_{ps \in DN_{im}} \frac{1}{2} TY_{ps}^{sh}(V_p + V_s),$$

wherein $DN_{im}$ is the set of line segments downstream to the importing device of the section, ps is a line segment defined by a bus p and a bus s, $Y_{ps}^{sh}$ is a 3 by 3 shunt admittance matrix for the line segment between bus p and s, $V_p$ and $V_s$ are 3 by 1 vectors of the phase-to-ground voltages of the bus p and the bus s.

5. The method of claim 4, wherein the $Y_{ps}^{sh}$ is predetermined from historical data stored in the memory, and wherein $V_p$ and $V_s$ are 3 by 1 vectors of the phase-to-ground voltages of bus p and bus s, and $V_p$ and $V_s$ are determined, when there is only one exporting device in the feeder section, bus p and bus s are resigned at a path between the importing device and the exporting device according to (1a):

$$V_t = \frac{d_{t-ex}}{d_{im-t} + d_{t-ex}} V_{im} + \frac{d_{im-t}}{d_{im-t} + d_{t-ex}} V_{ex},$$

wherein t is one of bus p or bus s, $V_{im}$ and $V_{ex}$ are vectors of phase-to-ground voltages measured at the importing device im and the exporting device ex, $d_{im-t}$ and $d_{t-ex}$ are a sum of lengths of line segments residing at the path from importing measuring device im to bus t, and from bus t to the at least one exporting device ex, respectively;

wherein $V_p$ and $V_s$ are determined, when there are two or more exporting devices in the feeder section, bus p and bus s are resigned at a path between the importing device and the exporting devices according to (2a):

$$V_t = \frac{1}{m} \sum_{i=1}^{m} \left( \frac{d_{t-ex_i}}{d_{im-t} + d_{t-ex_i}} V_{im} + \frac{d_{im-t}}{d_{im-t} + d_{t-ex_i}} V_{ex_i} \right),$$

where m is the total number of paths that pass through bus p and bus s, $ex_i$ is the at least one exporting device of the i-th path, $V_{ex_i}$ is the measured voltage of the at least one exporting device $ex_i$, $d_{t-ex_i}$ is the sum of length of line segments in the path from bus t to the at least one exporting device $ex_i$;

when bus p or bus s are not directly located on the path between the importing device and the at least one exporting device, and its power is supplied from bus t, wherein bus t is in the path between the importing device and the at least one exporting device, the voltage of bus t is determined by 1a, when there is only one exporting device in the feeder section, or 2a, when there are two or more exporting devices in the feeder section, then the voltage of bus p or bus s is determined to be equal to the voltage of the bus t.

6. The method of claim 1, further comprising:
determining the target active power for each phase of the importing device and currents at the importing device of the feeder section having a fault using voltages and currents measured at the importing device during the fault, wherein the target active power and currents at a faulty phase are adjusted with shunt currents of each line segment downstream to the importing device.

7. The method of claim 6, further comprising:
determining the shunt currents of the line segments based on a shunt admittance of a line segment and voltages of buses defining the line segment.

8. The method of claim 7, further comprising:
determining a set of voltages of buses of the feeder section based on voltages measured at the borders of the feeder section and lengths of the line segments, such that a voltage of a bus is a weighted average of the measured voltages with relative distances to the bus.

9. The method of claim 1, further comprising:
determining a set of WYE-connected resistances based on the difference between the active power for each phase of the importing device and the target active power for each phase of the importing device at each phase and phase-to-ground voltages measured at the importing device;

determining a set of DELTA-connected resistances using a WYE-DELTA transformation of equivalent resistances of active power for each phase of the importing device;

determining incremental phase-to-phase powers based on the set of DELTA-connected resistances and the phase-to-ground voltages measured at the importing device;

determining incremental scaling factors using a ratio of a incremental active phase-to-phase power and the base power defined by the load profile; and updating the scaling factors based on the incremental scaling factors.

10. The method of claim 9, further comprising:
determining the difference between the active power for each phase of the importing device and the target active power for each phase of the importing device according to $$\Delta P_{im,x} = P_{im,x} - P_{im,x}^{calculated},$$

wherein $\Delta P_{im,x}$ is the difference between the active power for each phase of the importing device and the target active power for each phase of the importing device at a phase x at the importing device, $x \in \{a,b,c\}$, $P_{im,x}^{calculated}$ is the active power on the phase x, $P_{im,x}$ is the target active power on the phase x;

determining the set of WYE-connected resistances according to $$\Delta R_{im,x} = |V_{im,x}|^2 / \Delta P_{im,x},$$

wherein $\Delta R_{im,x}$ is an equivalent resistance for the phase x at the importing device, $|V_{im,x}|$ is a magnitude of the phase-to-ground voltage measured at the importing device on the phase x;

determining the set of DELTA-connected resistances according to $$\Delta R_{im,ab} = \frac{\Delta R_{im,a}\Delta R_{im,b} + \Delta R_{im,b}\Delta R_{im,c} + \Delta R_{im,c}\Delta R_{im,a}}{\Delta R_{im,c}},$$

$$\Delta R_{im,bc} = \frac{\Delta R_{im,a}\Delta R_{im,b} + \Delta R_{im,b}\Delta R_{im,c} + \Delta R_{im,c}\Delta R_{im,a}}{\Delta R_{im,a}},$$

and $$\Delta R_{im,ca} = \frac{\Delta R_{im,a}\Delta R_{im,b} + \Delta R_{im,b}\Delta R_{im,c} + \Delta R_{im,c}\Delta R_{im,a}}{\Delta R_{im,b}},$$

wherein $\Delta R_{im,ab}$, $\Delta R_{im,bc}$ and $\Delta R_{im,ca}$ are equivalent DELTA-connected resistances between phases a and b, b and c, c and a, respectively;

determining the incremental active phase-to-phase power according to $$\Delta P_{im,xy} = \frac{|V_{im,xy}|^2}{\Delta R_{im,xy}},$$

wherein $\Delta P_{im,xy}$ is a incremental active power between phases x and y, $|V_{im,xy}|$ is the magnitude of phase-to-phase voltage between the phases x and y, and wherein $\Delta R_{im,xy}$ is an equivalent resistance for the phase x to phase y at the importing device; and determining the incremental scaling factors according to $$\Delta \alpha_{xy} = \frac{\Delta P_{im,xy}}{\sum_{p \in LD} P_{p,xy}^{base}} xy \in \{ab, bc, ca\},$$

wherein $\Delta \alpha_{xy}$ is the incremental scale factors for loads between the phases x and y, $P_{p,xy}^{base}$ is the base power of load connected to a bus p between the phases x and y, LD is the set of buses in the feeder section.

11. The method of claim 1, further comprising:
determining a current mismatch for each phase at the importing device;
determining incremental phase-to-phase currents based on the phase current mismatch;
determining incremental phase-to-phase powers based the incremental phase-to-phase currents and phase-to-ground voltages measured at the importing device;
determining incremental scaling factors using a ratio of an incremental active phase-to-phase power and the base power defined by the load profile; and
updating the scaling factors based on the incremental scaling factors.

12. The method of claim 11, further comprising:
determining the current mismatch for each phase at the importing device either when there is a no-fault in the feeder section, then go to step (1a), or when there is a phase-to-ground fault in the feeder section, then go to step (2a):
(1a) determine the current mismatch for each phase at the importing device when there is the no-fault in the feeder section, according to:

$$\Delta I_{im,x} = I_{im,x} - I_{im,x}^{calculated} \ x \in \{a,b,c\},$$

wherein $\Delta I_{im,x}$ is the current mismatch at the phase x at the importing device, a target current $I_{im,x}$ is measured at the importing device, and the current $I_{im,x}^{calculated}$ is determined by the power flow;

determining the incremental phase-to-phase currents according to $$\Delta I_{im,xy} = \frac{\Delta I_{im,x} - \Delta I_{im,y}}{2} \ xy \in \{ab, bc, ca\},$$

wherein $\Delta I_{im,y}$ is the current mismatch at the phase y at the importing device, and
wherein $\Delta I_{im,xy}$ is the incremental current between a phase x and a phase y wherein $y \in \{a,b,c\}$, $y \neq x$ at the importing device, then go to step (3a);
(2a) determine the current mismatch for each un-faulty phase at the importing device when there is the phase-to-ground fault in the feeder section, according to:

$$\Delta I_{im,y} = I_{im,y} - I_{im,y}^{calculated},$$

$$\Delta I_{im,z} = I_{im,z} - I_{im,z}^{calculated},$$

wherein, y and z are the first and the second un-faulty phases, $y \in \{a,b,c\}$, $z \in \{a, b, c\}$, $z \neq y$, and x is the faulty phase, $x \in \{a,b,c\}$, $x \neq y$, $x \neq z$, $\Delta I_{im,y}$ and $\Delta I_{im,z}$ are the current mismatches at the phase y and the phase z at the importing device, $I_{im,y}$ and $I_{im,z}$ are the currents measured at the phase y and the phase z at the importing device during the fault, $I_{im,y}^{calculated}$ and $I_{im,z}^{calculated}$ are the currents at the phase y and the phase z at the importing device determined by the power flow;

determining the incremental phase-to-phase currents according to $$\Delta I_{im,xy} = -\Delta I_{im,xy},$$

$$\Delta I_{im,yz} = \frac{\Delta I_{im,y} - \Delta I_{im,z}}{2},$$

$$\Delta I_{im,xz} = \Delta I_{im,z}$$

wherein $\Delta I_{im,yz}$ and $\Delta I_{im,zx}$ are the incremental currents between the phase y and the phase z, and the phase z and the phase x at the importing device;
(3a) determining a incremental active phase-to-phase power according to $$\Delta P_{im,xy} = |V_{im,xy}||\Delta I_{im,xy}|\cos[\angle V_{im,xy} - \angle(\Delta I_{im,xy})],$$

wherein $\Delta P_{im,xy}$ is the incremental active phase-to-phase power between the phase x and the phase y, $|\Delta I_{im,xy}|$ and $\angle(\Delta I_{im,xy})$ are a magnitude and a phase angle of incremental phase-to-phase current between the phase x and the phase y at the importing device, $|V_{im,xy}|$ and $\angle V_{im,xy}$ are a magnitude and a phase angle of the phase-to-phase voltage measured at the importing device between the phase x and the phase y; and
determining the incremental scaling factors according to $$\Delta \alpha_{xy} = \frac{\Delta P_{im,xy}}{\sum_{p \in LD} P_{p,xy}^{base}} \ xy \in \{ab, bc, ca\},$$

wherein $\Delta \alpha_{xy}$ is the incremental scaling factors for loads between the phases x and y, $P_{p,xy}^{base}$ is the base power of load connected to a bus p between the phases x and y, LD is the set of buses in the feeder section.

13. The method of claim 1, further comprising:
repeating the solving, the determining, and the updating until a difference between the active power for each phase of the importing device and the target active power for each phase of the importing device is below a threshold.

14. The method of claim 1, wherein the active power for each phase of the importing device is determined according to $$P_{im,x}^{calculated} = |V_{im,x}||I_{im,x}^{calculated}|\cos(\angle V_{im,x} - \angle I_{im,x}^{calculated}),$$

wherein $P_{im,x}^{calculated}$ is the active power on a phase x at the importing device, $x \in \{a,b,c\}$, wherein a, b, c are phases of the importing device, $|V_{im,x}|$ and $\angle V_{im,x}$ are a magnitude and a phase angle of a phase-to-ground voltage on the phase x measured at the importing device, $|I_{im,x}^{calculated}|$ and $\angle I_{im,x}^{calculated}$ are a magnitude and a phase angle of a phase current on the phase x through the importing device into the feeder section.

15. The method of claim 1, wherein the target active power for each phase of the importing device $P_{im,x}$ on the phase x at the importing device is determined according to $$P_{im,x} = |V_{im,x}||I_{im,x}|\cos(\angle V_{im,x} - \angle I_{im,x}),$$

wherein, $|I_{im,x}|$ and $\angle I_{im,x}$ are a magnitude and a phase angle of a phase current on the phase x measured at the importing device, $|V_{im,x}|$ and $\angle V_{im,x}$ are a magnitude and a phase angle of a phase-to-ground voltage on the phase x measured at the importing device.

16. The method of claim 1, further comprising:
determining incremental scaling factors as a result of dividing of incremental active phase-to-phase powers by base powers provided by load profiles, wherein the incremental active phase-to-phase powers are determined based on active power mismatches for each phase determined at the importing device through a DELTA-WYE transformation of equivalent resistances of active powers; and
updating the scaling factors with the incremental scaling factors.

17. The method of claim 1, further comprising:
determining incremental scaling factors as a result of dividing of incremental active phase-to-phase powers by base powers provided by load profiles, wherein the incremental active phase-to-phase powers are determined based on incremental phase-to-phase currents which determined by current mismatches for each phase determined at importing device; and
updating the scaling factors with the incremental scaling factors.

18. The method of claim 1, further comprising:
partitioning the feeder into the set of feeder sections bounded by measuring devices.

19. A system for determining power consumption of a load of an ungrounded power distribution system for monitoring power distribution system operations, the ungrounded power distribution system connects with a main grid through transformers with ungrounded winding connections, wherein downstream of the transformers are a multitude of ungrounded feeders, each ungrounded feeder includes a set of ungrounded feeder sections, and each ungrounded feeder section includes at least one pair of buses connected by line segments, such that each bus includes two or more phases and at least one bus includes a load connected between at least two phases of the at least one bus, wherein each ungrounded feeder section is defined by an importing device connecting the ungrounded feeder section with an upstream ungrounded feeder section within the ungrounded feeder, and by at least one exporting device connecting the ungrounded feeder section with a downstream feeder section within the ungrounded feeder, the system comprising:
a processor, coupled to a data storage memory unit, the processor configured to perform the steps of:
determining a power consumption of each load of at least one bus connected between at least two phases of the at least one bus of each ungrounded feeder section of each ungrounded feeder of the multitude of ungrounded feeders, the power consumption for each load is a product of:
a scaling factor for each load connected between two phases, and
a base power defined by a load profile of the load;
solving a power flow of the ungrounded feeder section using the power consumptions of the loads by treating the buses of importing device as a constant voltage bus and the buses of the at least one exporting device as a constant power bus to produce an active power for each phase of the importing device;
determining a target active power for each phase of the importing device using measurements of voltage and current for each phase at the importing device; and
updating the scaling factors based on a difference between the active power for each phase of the importing device and the target active power for each phase of the importing device to determine the power consumption of loads in the ungrounded power distribution system so as to assist in monitoring operations of the power distribution system.

* * * * *